(12) United States Patent
Yang et al.

(10) Patent No.: US 6,444,042 B1
(45) Date of Patent: Sep. 3, 2002

(54) GAS INJECTION SYSTEM FOR CHEMICAL VAPOR DEPOSITION DEVICE

(75) Inventors: Seung Yoon Yang; In Jae Park; Jong Woo Yoon, all of Choongcheongbuk-Do; Chang Jae Kim, Seoul, all of (KR); Tanigawa Eiki, Tokyo (JP)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/511,890

(22) Filed: Feb. 23, 2000

(30) Foreign Application Priority Data

Feb. 25, 1999 (KR) .............................................. 99-6359

(51) Int. Cl.$^7$ ............................................... C23C 16/00
(52) U.S. Cl. ..................................... 118/724; 118/715
(58) Field of Search ................................. 118/715, 724

(56) References Cited

U.S. PATENT DOCUMENTS

| | | | |
|---|---|---|---|
| 4,993,358 A | | 2/1991 | Mahawili ..................... 118/715 |
| 5,156,820 A | * | 10/1992 | Wong ......................... 118/725 |
| 5,275,976 A | * | 1/1994 | Moslehi ....................... 118/715 |
| 5,446,824 A | * | 8/1995 | Moslehi ....................... 118/724 |
| 5,551,985 A | * | 9/1996 | Brors ......................... 118/725 |
| 5,595,606 A | * | 1/1997 | Fujikawa ..................... 118/715 |
| 5,624,498 A | * | 4/1997 | Lee ........................... 118/715 |
| 5,647,911 A | * | 7/1997 | Vanell ........................ 118/715 |
| 5,653,806 A | * | 8/1997 | Van Buskirk ............... 118/715 |
| 5,728,223 A | * | 3/1998 | Murakami ................... 118/715 |
| 5,792,269 A | | 8/1998 | Deacon et al. .............. 118/715 |
| 5,878,191 A | * | 3/1999 | Miyashita ................... 392/416 |
| 5,935,337 A | * | 8/1999 | Takeuchi .................... 118/724 |
| 5,950,925 A | * | 9/1999 | Fukunaga ................... 118/715 |
| 6,110,289 A | * | 8/2000 | Moore ........................ 118/724 |

OTHER PUBLICATIONS

Webster's Third New International Dictionary, Unabridged, Merriam–Webster Inc., 1993, page 1173.*

* cited by examiner

Primary Examiner—Richard Bueker
(74) Attorney, Agent, or Firm—Morgan, Lewis & Bockius LLP

(57) ABSTRACT

A gas injection system for a chemical vapor deposition device includes a gas providing pipe providing gases into the system, a shower head unit coupled to the gas providing pipe for evenly injecting the gases on a wafer, and a temperature control unit coupled to the shower head unit for controlling a temperature of the shower head unit.

25 Claims, 8 Drawing Sheets

GAS INJECTION SYSTEM FOR CHEMICAL VAPOR DEPOSITION DEVICE

This application claims the benefit of Korean Application No. 6359/1999 filed Feb. 25, 1999, which is hereby incorporated by reference.

BACKGROUND OF THE INVENTION

1. Field of the Invention

The present invention relates to a chemical vapor deposition device, and particularly, to a gas injection system for a chemical vapor deposition device. Although the present invention is suitable for a wide scope of applications, it is particularly suitable for improving process performance by facilitating temperature control at a shower head unit and by restricting generation of particles causing contamination, and evenly providing gas at a surface of a wafer.

2. Description of the Related Art

In order to form a BST [$(Ba,Sr)TiO_3$] thin film, gas phases of barium, strontium, titanium, and oxygen are provided at a surface of a wafer positioned in a chamber, and chemical reactions of the gases.

Constitution of a conventional CVD device is described with reference to the accompanying drawings.

FIG. 1 is a schematic view illustrating the conventional CVD device including a chamber 10 having a space of a predetermined size, a heater casing 20 provided in the chamber 10, a heater 30 provided in the heater casing 20, a wafer 40 positioned at the upper portion of the heater casing 20, and a shower head unit 70 engaged with a gas providing pipe and having a nozzle plate 60 for injecting gases on the wafer 50. Additionally, an exhaust pipe (not shown) engaged with the chamber 10 is provided for externally discharging the gases from the chamber 10. There are also provided an exhaust pipe (not shown) and a vacuum pump (not shown) for producing a vacuum inside the chamber 10.

The shower head unit 70 for a gas injection will now be explained in more detail with reference to FIGS. 2 through 5.

FIG. 2 is a partial cross-sectional view illustrating the shower head unit 70. FIGS. 3 and 4 are a front view and a cross-sectional view respectively illustrating the nozzle plate 60 positioned at the bottom portion of the shower head unit 70. FIG. 5 is an enlarged view of portion II in FIG. 4.

At the upper portion of the shower head unit 70, a heater 71 is provided for maintaining the gases (barium, strontium, titanium and oxygen) provided through the gas providing pipe 50 at an elevated temperature. In addition, a buffer space 72 is formed inside the shower head unit 70 in order for the gases to be widely diffused. The nozzle plate 60 for evenly injecting the gases on the wafer 40 is provided at the bottom portion of the buffer space 72. Here, a plurality of nozzles 61 are formed at the nozzle plate 60 in order to evenly inject the gases on the wafer 40.

Operation of the conventional CVD device will now be described.

Firstly, the wafer 40 is positioned at the upper portion of the heater casing 20 in the chamber 10 by a wafer transfer (not shown). The chamber 10 is under a vacuum condition maintained by a vacuum pump (not shown). Thereafter, the gases (barium, strontium, titanium, and oxygen) having a predetermined temperature are introduced into the shower head unit 70 through the gas providing pipe 50 and widely diffused in the buffer space 72.

Here, the gases diffused in the buffer space 72 of the shower head unit 70 are maintained at a predetermined temperature by the heater 71. The diffused gases are injected onto the wafer 40 through the plurality of nozzles 61 of the nozzle plate 60. On the other hand, a temperature of the wafer 40 positioned at the upper portion of the heater casing 20 is increased to approximately 500° C. by the heater 30. Accordingly, the gases in the chamber 10, such as barium, strontium, titanium, and oxygen are mixed and reacted one another. As a result, a resultant material is deposited at the surface of the wafer 40, thereby forming a BST thin film.

The heater 30 has a higher temperature than the wafer 40 in order to increase its temperature. However, in the gas injection system for the conventional CVD device, a radiant heat of the heater 30 is transmitted into the shower head unit 70, thus increasing a temperature of the shower head unit 70. As a result, the temperature of the gases become higher than a desired temperature. Therefore, the gases are partially reacted in the buffer space 72 of the shower head unit 70. Also, a chemical reaction does not start on the wafer but in the shower head unit 70, thereby generating particles that are a main cause of contamination. As a result, it reduced the process performance.

In order to overcome such a disadvantage, the nozzle plate 60 of the shower head unit 70 must be positioned separately from the wafer 40 by a predetermined distance. However, such a modification creates another problem because it is difficult to keep the size of the CVD device at a minimum.

SUMMARY OF THE INVENTION.

Accordingly, the present invention is directed to a gas injection system for chemical vapor deposition device that substantially eliminates one or more of problems due to limitations and disadvantages of the related art.

Another object of the present invention is to provide a gas injection system for a chemical vapor deposition (CVD) device which can restrict generation of particles causing contamination by facilitating a temperature control of a shower head unit in regard to gases sensitive to the temperature, and which can improve process performance.

To achieve these and other advantages and in accordance with the purpose of the present invention, as embodied and broadly described, a gas injection system for a chemical vapor deposition (CVD) device includes a gas providing pipe providing gases into the system, a shower head-unit coupled to the gas providing pipe for evenly injecting the gases on a wafer, and a temperature control unit coupled to the shower head unit for controlling a temperature of the shower head unit.

In another aspect of the present invention, a gas injection system for a chemical vapor deposition (CVD) device includes a gas providing pipe providing gases into the system, a shower head unit coupled to the gas providing pipe for evenly injecting the gases on a wafer, a heating system coupled to the shower head unit for controlling a temperature of the shower head unit, a cooling system coupled to the heating system for controlling a temperature of the heating system, and a temperature sensor coupled to the shower head unit.

It is to be understood that both. the foregoing general description and the following detailed description are exemplary and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIGS. 9A through 9C illustrate a distribution plate of the gas injection system according to the first embodiment of the present invention, wherein:

FIG. 9A is a plan view;

FIG. 9B is a cross-sectional view taken along line IXB–IXB' in FIG. 9A; and

FIG. 9C is a rear view;

DETAILED DESCRIPTION OF THE PREFERRED EMBODIMENTS

Reference will now be made in detail to the preferred embodiments of the present invention, examples of which are illustrated in the accompanying drawings.

Initially referring to FIG. 6, a gas injection system for a chemical vapor deposition (CVD) device according to a first embodiment of the present invention will now be described.

Figure 1:
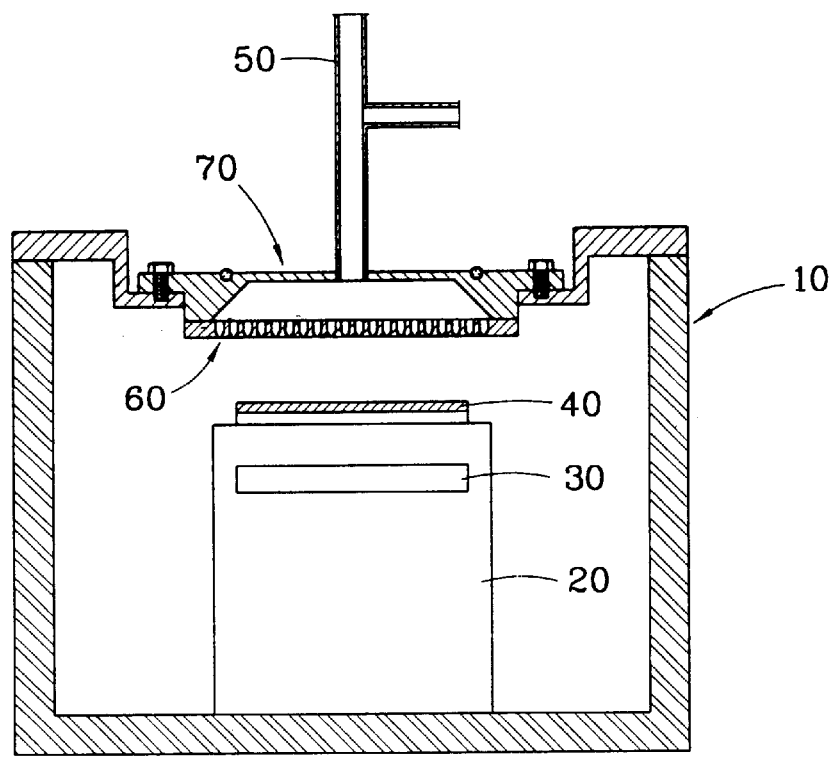
FIG. 1 is a schematic structure view illustrating a conventional chemical vapor deposition (CVD) device.
Figure 2:
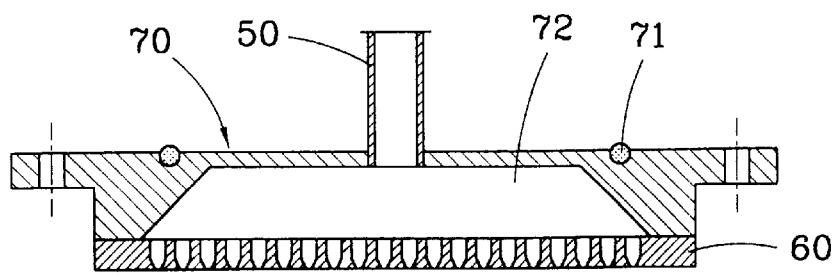
FIG. 2 is a cross-sectional view schematically illustrating a gas injection system for the conventional CVD device.
Figure 3:
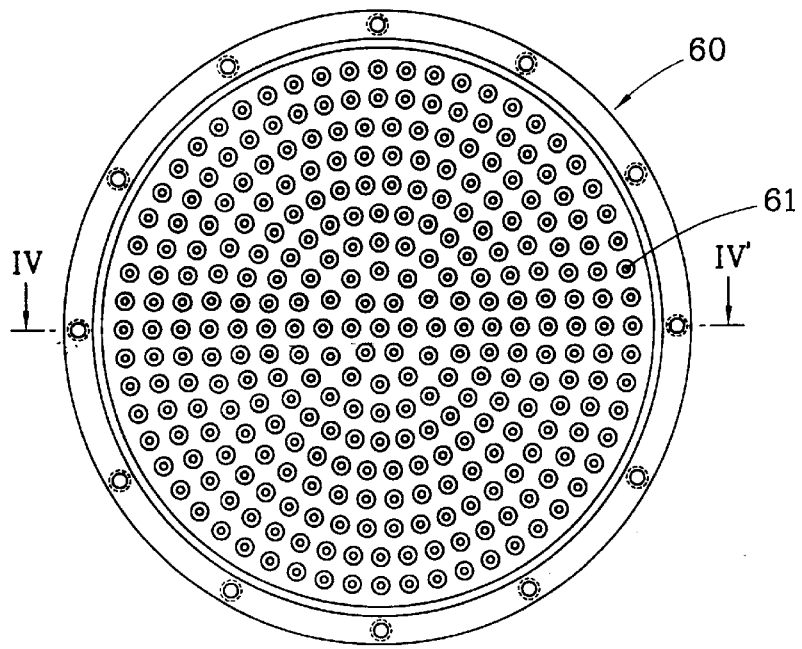
FIG. 3 is a plan view illustrating a conventional nozzle plate.
Figure 4:
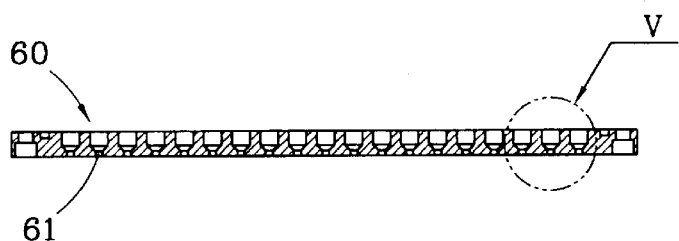
FIG. 4 is a cross-sectional view taken along line IV–IV' in FIG. 3.
Figure 5:
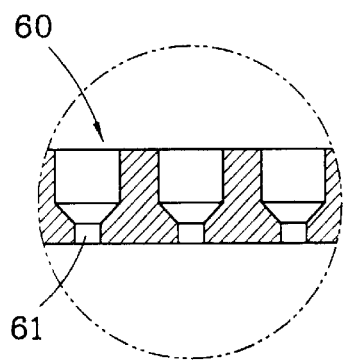
FIG. 5 is an enlarged view of portion V in FIG. 4.
Figure 6:
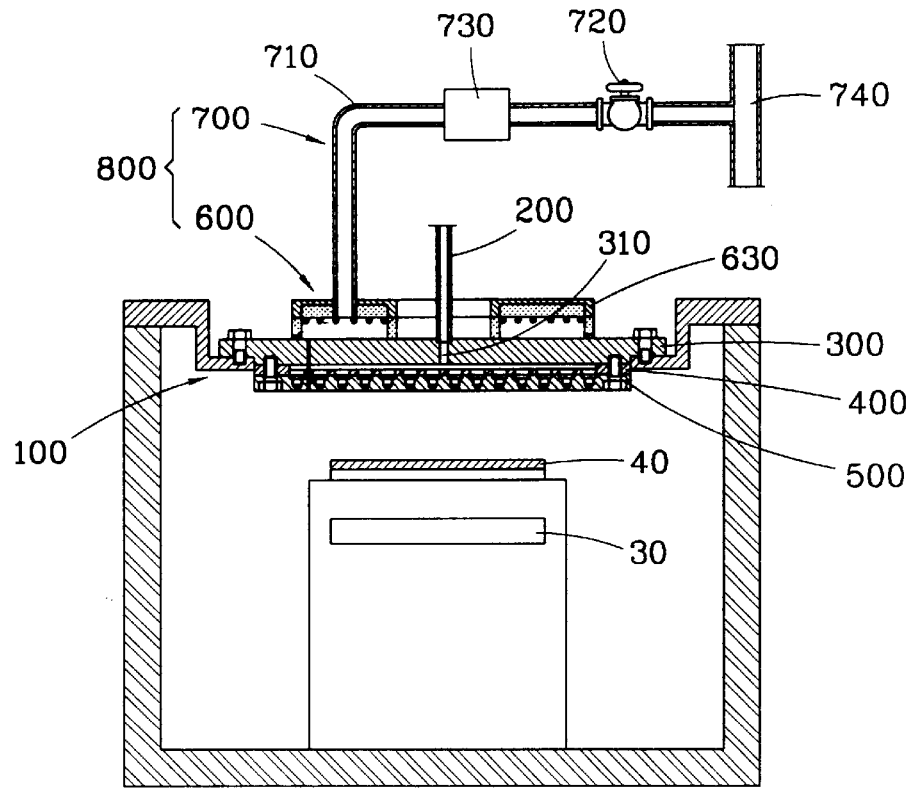
FIG. 6 is a schematic view illustrating a chemical vapor deposition (CVD) device employing a gas injection system according to a first embodiment of the present invention.
Figure 7:
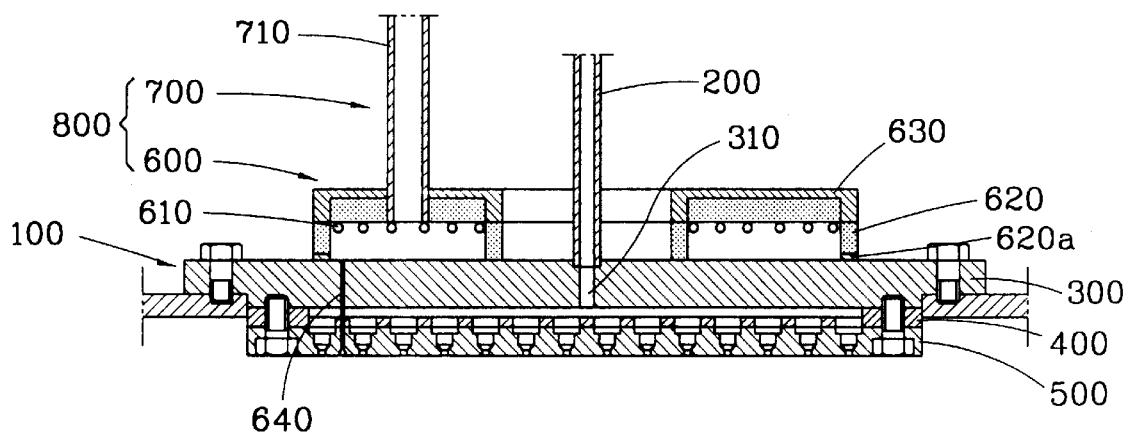
FIG. 7 is a partial enlarged view illustrating the gas injection system according to the first embodiment of the present invention.
Figure 8:
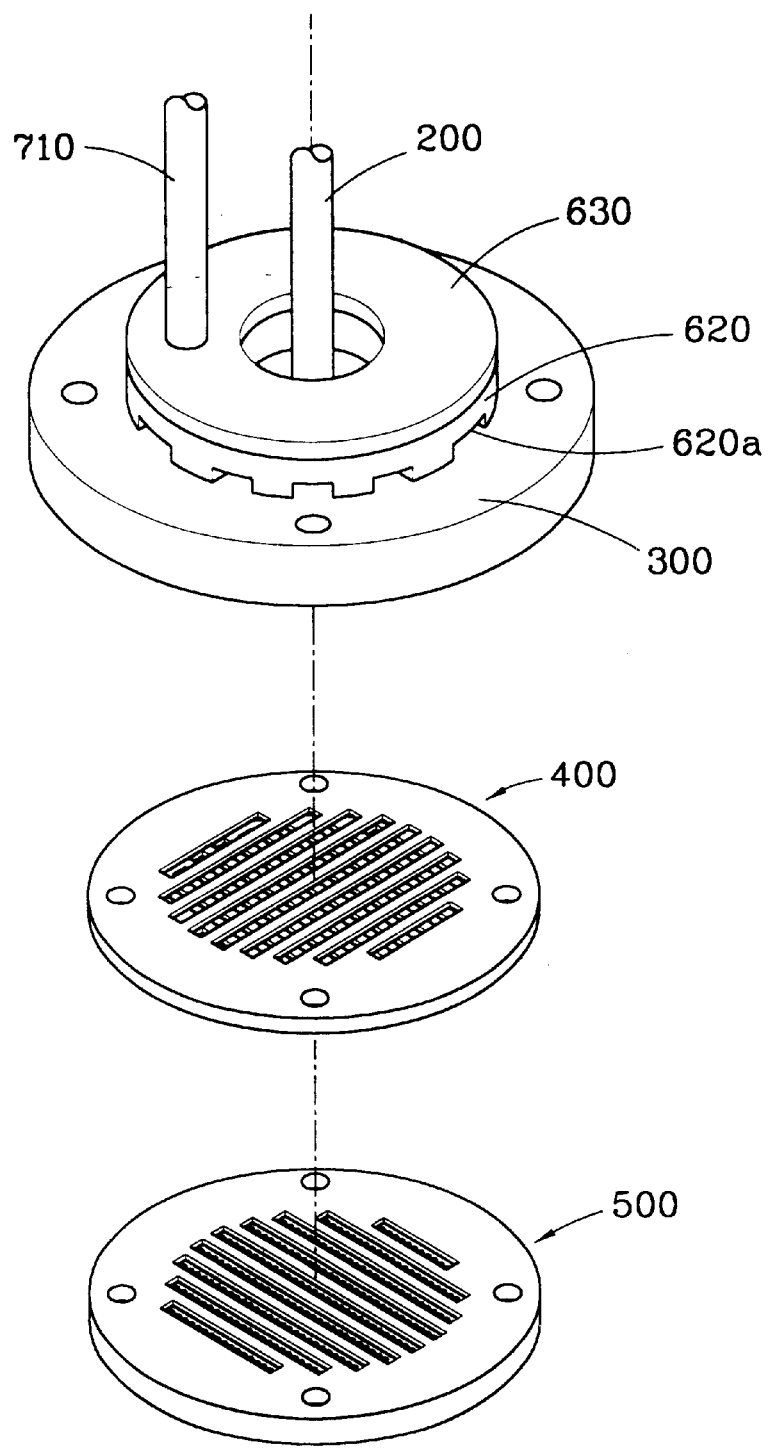
FIG. 8 is an enlarged perspective view illustrating the gas injection system according to the first embodiment of the present invention.

FIG. 6 is a cross-sectional view illustrating the CVD device employing the gas injection system according to the first embodiment of the present invention. FIGS. 7 and 8 are an enlarged cross-sectional view and an enlarged perspective view, respectively, illustrating the gas injection system according to the present invention, including a shower head unit 100 and a temperature control system 800 for controlling a temperature of the shower head unit 100.

More specifically, the shower head unit 100 includes a heat transmitting member 300 made of Duralumin (i.e., an alloy of aluminum, copper, magnesium, and manganese) and having a gas providing hole 310 to be engaged with a gas providing pipe 200 and a distribution plate 400 made of an aluminum material positioned at the bottom surface of the heat transmitting member 300 for evenly distributing a flow of gases provided through the gas providing hole 310 through the gas providing pipe 200. A nozzle plate 500 made of an aluminum material is positioned at the bottom surface of the distribution plate 400 for evenly injecting the gases on the wafer that have been evenly distributed at the distribution plate 400.

The above-mentioned distribution plate and nozzle plate will now be described in more detail with reference to the following accompanying drawings.

Figure 9A:
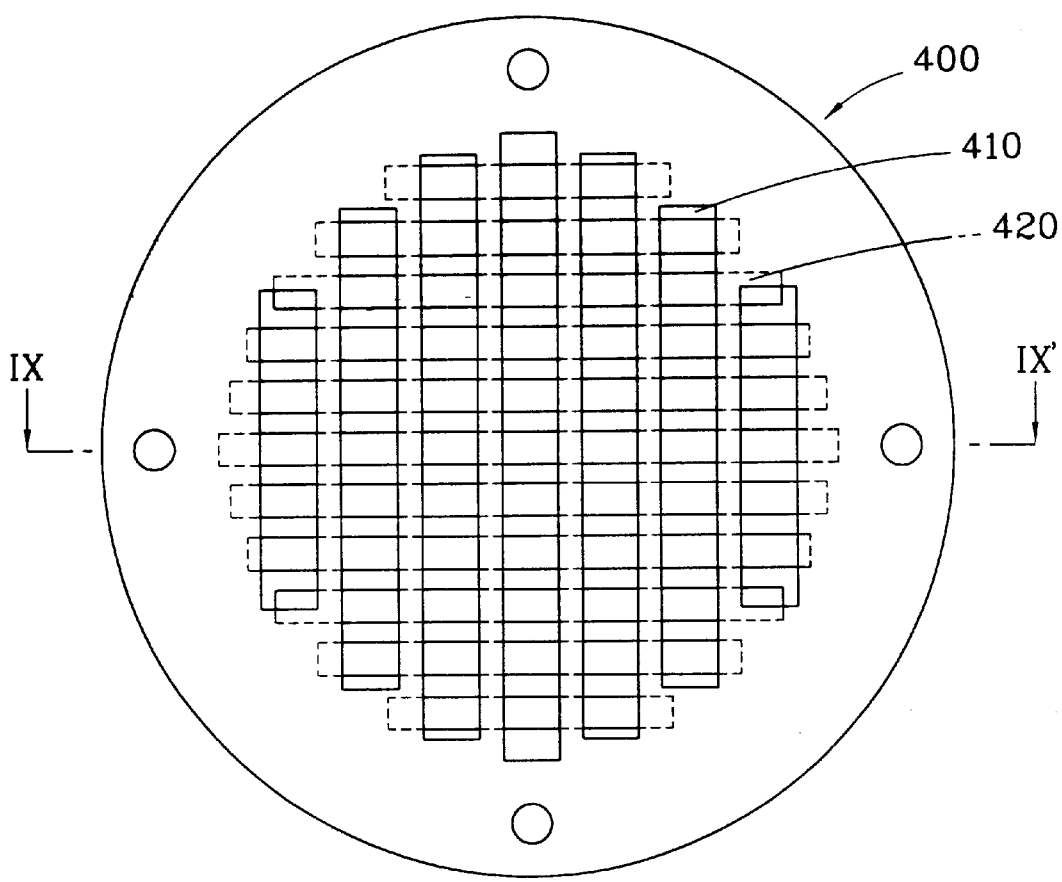
Figure 9B:
Figure 9C:
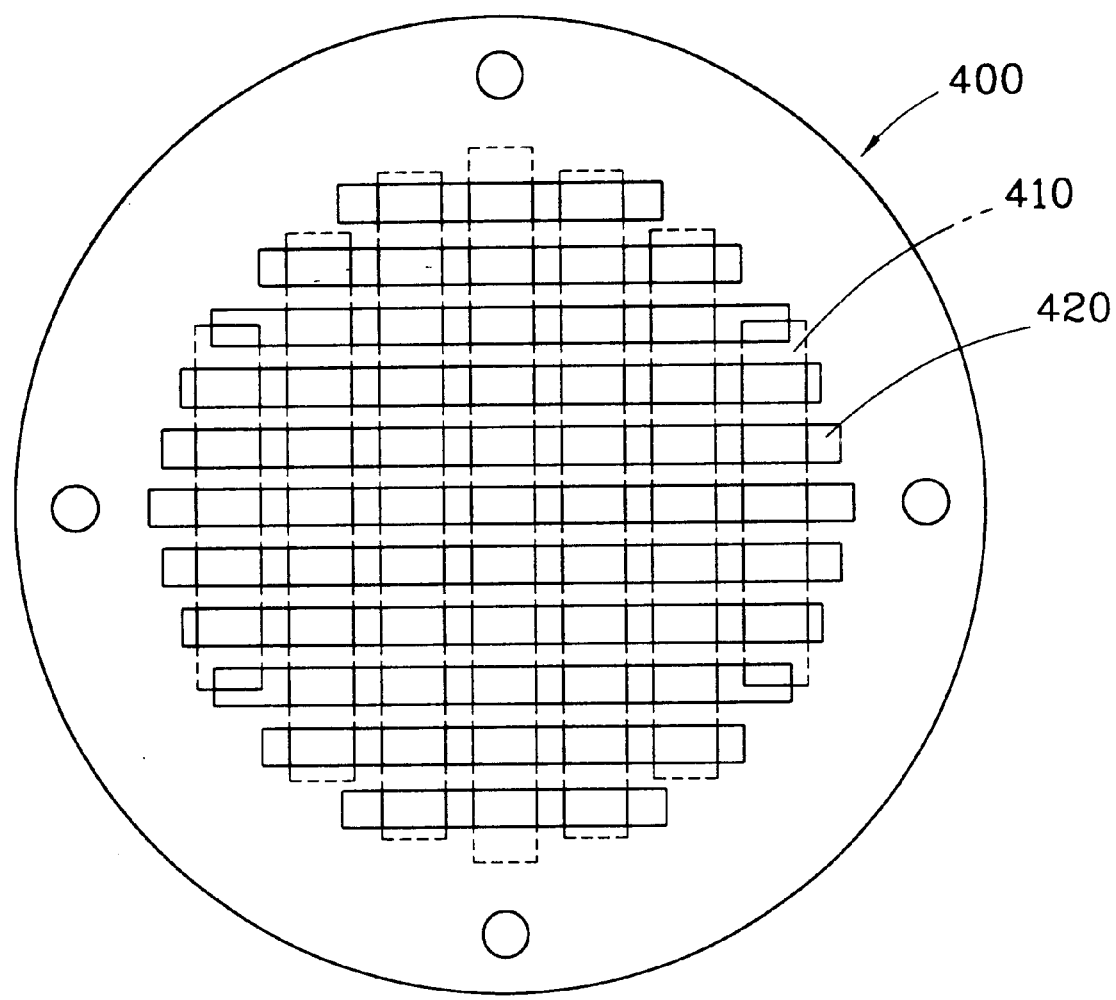

FIGS. 9A to 9C illustrate the distribution plate 400. FIG. 9A is a plan view illustrating the distribution plate 400. FIG. 9B is a cross-sectional view taken along line IX–IX' in FIG. 9A. FIG. 9C is a rear view illustrating the distribution plate 400.

As illustrated in FIG. 9A, a plurality of first rectangular grooves 410 are formed at the upper portion of the distribution plate 400. A plurality of second rectangular grooves 420 are formed at the lower portion and are perpendicular to the first grooves 410, as shown in FIG. 9C. The number of the second grooves 420 is greater than the number of the first grooves 410. The first grooves 410 and the second grooves 420 intersect each other at a right angle. Thus, a through hole is formed at every crossover.

Figure 10:
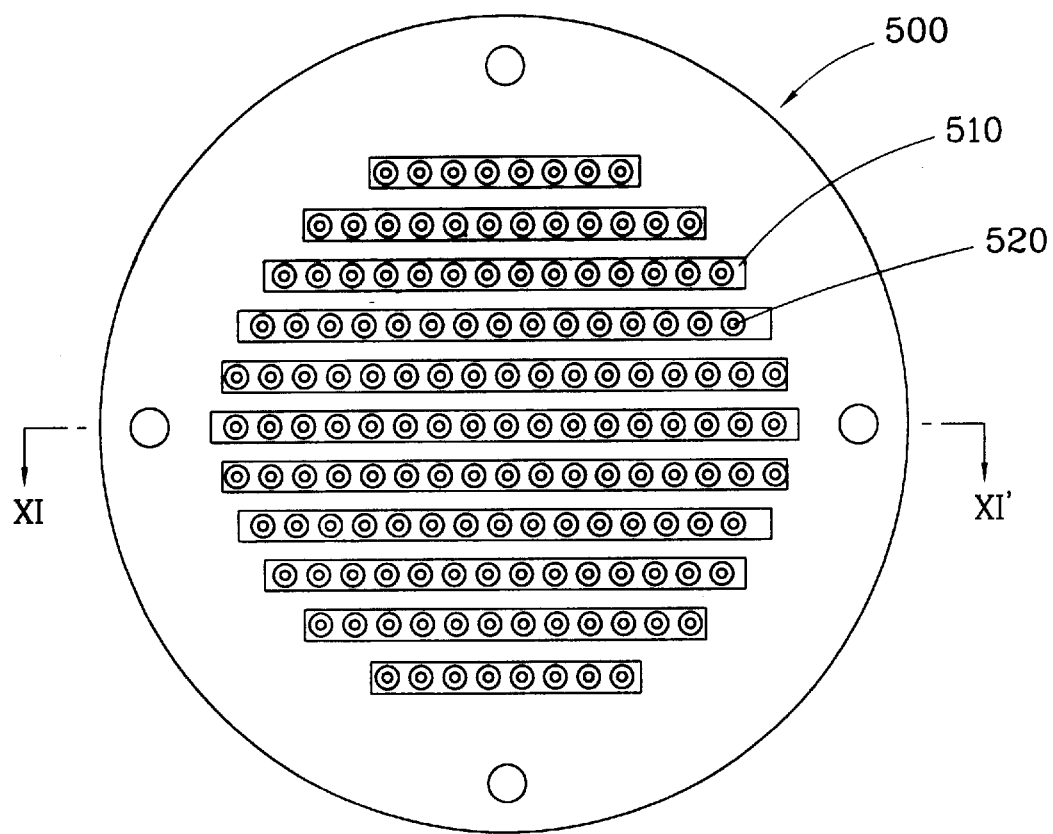
FIG. 10 is a plan view illustrating a nozzle plate of the gas injection system according to the first embodiment of the present invention.
Figure 11:
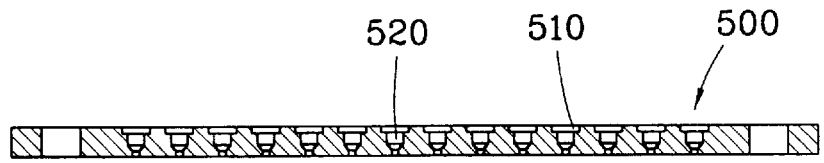
FIG. 11 is a cross-sectional view taken along line XI–XI' in FIG. 10.

FIG. 10 is a plan view illustrating the nozzle plate 500 while FIG. 11 is a cross-sectional view taken along line XI–XI' in FIG. 10.

As illustrated in FIGS. 10 and 11, a plurality of grooves 510 are formed at the upper portion of the nozzle plate 500. Here, the number of the grooves 510 is the same as that of the second rectangular grooves 420 of the distribution plate 400. A plurality of nozzles 520 are formed at the grooves 510, thereby evenly injecting the gases on the wafer 40 which have been distributed at the distribution plate 400.

As shown in FIG. 8, the distribution plate 400 and nozzle plate 500 are assembled so that the grooves 420 at the bottom portion of the distribution plate 400 and the grooves 510 of the nozzle plate 500 may be positioned at the same direction.

Alternatively, without the distribution plate 400 having the first rectangular grooves 410 and the second rectangular grooves 420, the first rectangular grooves 410 and the second rectangular grooves 420 may be formed respectively at the heat transmitting member 300 and the nozzle plate 500 as a single body.

Figure 12:
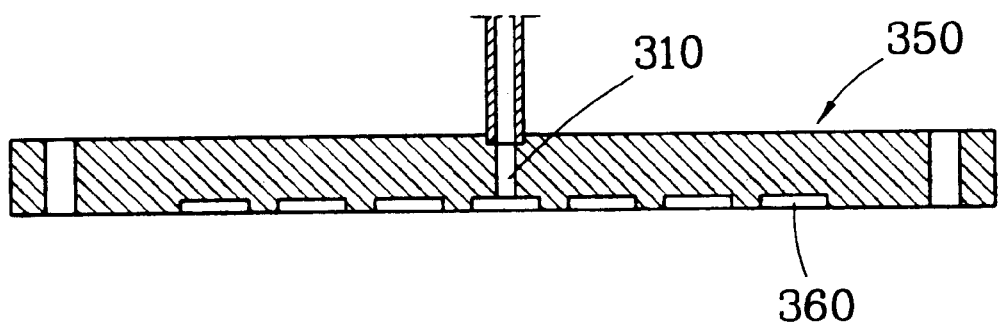
FIG. 12 is a cross-sectional view illustrating a heat transmitting member according to a second embodiment of the present invention.
Figure 13:
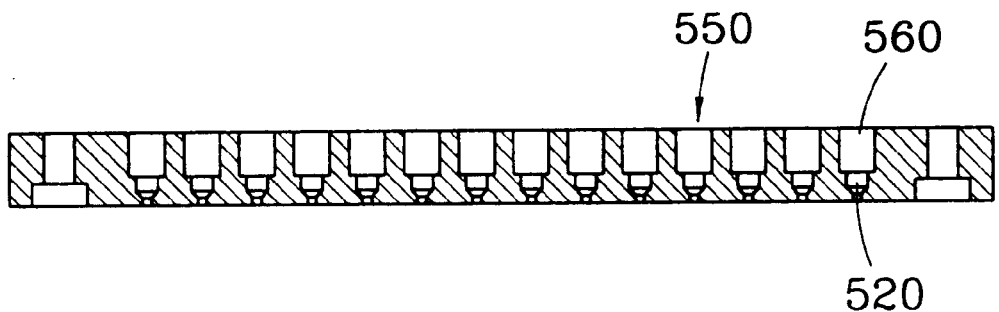
FIG. 13 is a cross-sectional view illustrating a nozzle plate according to the second embodiment of the present invention.

FIGS. 12 and 13 are cross-sectional views respectively illustrating a heat transmitting member and a nozzle plate according to a second embodiment of the present invention.

A plurality of grooves 360 corresponding to the first rectangular grooves 410 at the distribution plate 400 are formed at the bottom surface of the heat transmitting member 350. The groove positioned at its center portion is engaged with the gas providing hole 310 through which the gases are provided. In other words, the first rectangular grooves 410 of the distribution plate 400 are formed at the heat transmitting member 350 as a single body.

Therefore, a plurality of grooves 560 corresponding to the second rectangular grooves 420 of the distribution plate 400 are formed at the upper portion of the nozzle plate 550. A plurality of nozzles are formed at the grooves 560. Thus, the second rectangular grooves 420 of the distribution plate 400 are formed at the nozzle plate 550 as a single body.

The heat transmitting member 350 and nozzle plate 550 according to the second embodiment of the present invention are assembled so that their grooves 360 and 560 may intersect each other at a right angle, wherein a total number of the grooves 360 is less than a total number of the grooves 560.

On the other hand, as shown in FIG. 6, the temperature control system 800 includes a heating system 600 provided at the upper portion of the heat transmitting member 300 and a cooling system 700 engaged with the heating system 500.

The heating system 600 and cooling system 700 will now be explained in more detail with reference to FIGS. 6 and 7.

The heating system 600 includes a tube-type heater having a plurality of heating tubes 610 provided at the upper portion of the heat transmitting member 300 and an insulating member 620 made of a material able to resist a temperature over 500° C., such as mica, for example, and surrounding the upper and both side portions of the heater 610 in order to block the heat generated from the heater 610. A cover 630 covers the upper portion of the insulating member 620. A temperature sensor 640 is positioned in a straight line from the upper portion of the heat transmitting member 300 to a portion apart from the bottom surface of the nozzle plate 500 by 2 mm.

Here, a plurality of through holes 620a are formed in the insulating member 620 at predetermined intervals so that the air may be externally introduced into the insulating member 620. In addition, the temperature sensor 640 may be installed in a straight line from the bottom surface of the heat transmitting member 300 to the bottom surface of the nozzle plate 500.

The cooling system 700 includes a connecting pipe 710 engaged with the inside of the insulating member 620 where the heater 610 is installed with a motor-driven blower 730 having an inverter (not shown) at a predetermined portion of the connecting pipe 710, a valve 720 installed at the connecting pipe 710 with one side connected to the blower 730, and a main duct 740 installed at the connecting pipe 710 to the other side of the valve 720. The previously described components are sequentially constituted.

The temperature controlling operation of the previously described gas injection system will now be described.

In the heating operation, when a measured temperature value of the temperature sensor 640 provided at the shower head unit 100 is lower than a preferable one, the heater 610 begins to operate. The heater 610 begins to generate the heat for an even temperature at the heat transmitting member 300, thereby increasing the temperature of the nozzle plate 500 to a preferable one through the distribution plate 400.

The cooling operation begins when a measured temperature of the temperature sensor 640 provided at the shower head unit 100 is higher than preferable. In other words, when the temperature is increased by radiant heat generated from the heater 30 provided at the bottom portion of the wafer (not shown), the blower 730 begins to operate. Thus, the heat transmitting member 300 is cooled by the air provided through the through hole 620a of the insulating member 620, thereby decreasing the temperature of the nozzle plate 500 to a preferable one through the distribution plate 400.

The above-described heating or cooling operation of the shower head unit 100 is carried out by heat transmission among the heat transmitting member 300, the distribution plate 400, and the nozzle plate 500 connected one another.

In this case, there may be a problem for the shower head unit 100 to evenly inject the gases. A sufficient space is required in order to evenly inject the gases. Therefore, the distribution plate 400 is deposed so as to solve this problem. That is, the distribution plate 400 replaces the buffer space 71 required in the conventional shower head unit 70 to evenly inject the gases, and serves to evenly spread out the gases provided through a single line at the nozzle plate 500.

The heater of the heating system according to the above-described embodiment of the present invention is a tube-type heater having a plurality of heating tubes. Alternatively, a plate-type heater having a heating plate or a lamp may be employed. The cooling system according to the above embodiment of the present invention is an air cooling system. A water cooling system or chiller may be employed as an alternative for the cooling system.

Accordingly, in the gas injection system for the CVD device according to the present invention, the process is carried out at a high temperature. Thus, the cooling system is provided for dealing with heating of the shower head unit by the radiant heat generated from the heater at the bottom portion of the wafer. The heating system for generating heat is also provided when it is required. As a result, the temperature of the shower head unit is readily controllable while gases to be provided into the system are maintained at a predetermined temperature, thereby preventing contamination. In addition, the process performance is improved by preventing an undesireable reaction of the gases caused by heat. Also, a distance between the shower head unit and the wafer is reduced by at least 10 mm, thus minimizing the size of the CVD. device.

It will be apparent to those skilled in the art that various modifications and variations can be made in gas injection system for chemical vapor deposition device of the present invention without departing from the spirit or scope of the inventions. Thus, it is intended that the present invention cover the modifications and variations of this invention provided they come within the scope of the appended claims and their equivalents.

What is claimed is:

1. A gas injection system for a chemical vapor deposition device, comprising:

a gas providing pipe providing gases into the system;

a shower head unit including a heat transmitting member, a distribution plate, and a nozzle plate coupled to the gas providing pipe for evenly injecting the gases on a wafer; and a temperature control unit coupled to the shower head unit for controlling a temperature of the shower head unit, wherein the distribution plate includes a first plurality of continuous rectangular grooves formed on a first surface of the distribution plate along a first direction, and a second plurality of continuous rectangular grooves formed on a second surface opposite to the first surface of the distribution plate along a second direction perpendicular to the first direction, wherein a total number of the first plurality of continuous rectangular grooves is greater than a total number of the second plurality of continuous rectangular grooves.

2. The gas injection system according to claim 1, wherein the heat transmitting member has a gas providing hole engaged with the gas providing pipe, the distribution plate is positioned at a bottom surface of the heat transmitting member for evenly distributing the gases provided through the gas providing pipe, and the nozzle plate is positioned at the first surface of the distribution plate for further evenly distributing the gases on the wafer.

3. The gas injection system according to claim 2, wherein the distribution plate and the nozzle plate are formed of aluminum.

4. The gas injection system according to claim 2, wherein the first plurality of continuous rectangular grooves and the second plurality of continuous rectangular grooves intersect each other, thereby forming holes at portions where the first plurality of continuous rectangular grooves and the second plurality of continuous rectangular grooves intersect.

5. The gas injection system according to claim 2, wherein the heat transmitting member is made of an alloy of aluminum, copper, magnesium, and manganese.

6. The gas injection system according to claim 2, wherein the nozzle plate has a plurality of third continuous rectangular grooves, a total number of the plurality of third continuous rectangular grooves is equal to the total number of the second plurality of continuous rectangular grooves of the distribution plate.

7. The gas injection system according to claim 6, wherein there are a plurality of nozzles in the plurality of third continuous rectangular grooves.

8. The gas injection system according to claim 6, wherein the plurality of third continuous rectangular grooves are aligned along the second direction.

9. The gas injection system according to claim 2, wherein the temperature control system includes:
   a heating system at an upper portion of the shower head unit; and
   a cooling system coupled to the heating system.

10. The gas injection system according to claim 9, wherein the cooling system includes an air cooling system.

11. The gas injection system according to claim 10, wherein the air cooling system includes:
   a connecting pipe to be engaged with the heating system;
   a valve coupled to the connecting pipe;
   a motor-driven blower provided between the heating system and the valve; and
   a main duct coupled to the valve.

12. The gas injection system according to claim 9, wherein the cooling system includes a water cooling system.

13. The gas injection system according to claim 9, wherein the cooling system includes a chiller.

14. The gas injection system according to claim 9, wherein the heating system includes:
   a heater at an upper portion of the heat transmitting member;
   an insulating member surrounding upper and side portions of the heater, and having a plurality of through holes for providing air to the heat transmitting member;
   a cover for covering the upper portion of the insulating member; and
   a temperature sensor in the shower head unit.

15. The gas injection system according to claim 14, wherein the heater includes a lamp.

16. The gas injection system according to claim 14, wherein the temperature sensor is positioned in a straight line from the upper portion of the heat transmitting member to the nozzle plate.

17. The gas injection system according to claim 16, wherein the temperature sensor is separated apart from a bottom surface of the nozzle plate by 2 mm.

18. The gas injection system according to claim 14, wherein the temperature sensor is provided in a straight line from an upper surface of the distribution plate to within a bottom surface of the nozzle plate by 2 mm.

19. The gas injection system according to claim 14, wherein the insulating member is capable of resisting a temperature over 500° C.

20. The gas injection system according to claim 19, wherein the insulating member is made from mica.

21. The gas injection system according to claim 14, wherein the heater includes a plurality of heating tubes.

22. The gas injection system according to claim 14, wherein the heater includes a heating plate.

23. A gas injection system for a chemical vapor deposition device, comprising:
   a gas providing pipe providing gases into the system;
   a shower head unit including a heat transmitting member, a distribution plate, and a nozzle plate coupled to the gas providing pipe for evenly injecting the gases on a wafer;
   a heating system coupled to the shower head unit for controlling a temperature of the shower head unit;
   a cooling system coupled to the heating system for controlling a temperature of the heating system; and
   a temperature sensor coupled to the shower head unit,
   wherein the temperature sensor is provided in a straight line from an upper surface of the distribution plate to within a bottom surface of the nozzle plate by 2 mm.

24. The gas injection system according to claim 23, wherein the heat transmitting member has a gas providing hole engaged with the gas providing pipe, the distribution plate is positioned at a bottom surface of the heat transmitting member for evenly distributing the gases provided through the gas providing pipe, and the nozzle plate is positioned at a bottom surface of the distribution plate for further evenly distributing the gases on the wafer.

25. The gas injection system according to claim 24, wherein the heating system includes:
   a heater at an upper portion of the heat transmitting member;
   an insulating member surrounding upper and side portions of the heater, and having a plurality of through holes for providing air to the heat transmitting member; and
   a cover for covering an upper portion of the insulating member.

* * * * *